(12) United States Patent
Kimura et al.

(10) Patent No.: US 7,598,504 B2
(45) Date of Patent: Oct. 6, 2009

(54) WRITING ERROR DIAGNOSIS METHOD FOR CHARGED PARTICLE BEAM PHOTOLITHOGRAPHY APPARATUS AND CHARGED PARTICLE BEAM PHOTOLITHOGRAPHY APPARATUS

(75) Inventors: Hayato Kimura, Shizuoka (JP); Yujin Handa, Shizuoka (JP); Seiji Wake, Shizuoka (JP); Takuya Matsukawa, Shizuoka (JP); Seiichi Tsuchiya, Shizuoka (JP)

(73) Assignee: NuFlare Technology, Inc., Numazu-shi (JP)

( * ) Notice: Subject to any disclaimer, the term of this patent is extended or adjusted under 35 U.S.C. 154(b) by 357 days.

(21) Appl. No.: 11/754,500

(22) Filed: May 29, 2007

(65) Prior Publication Data

US 2008/0067423 A1   Mar. 20, 2008

(30) Foreign Application Priority Data

May 30, 2006   (JP) .............................. 2006-150385

(51) Int. Cl.
*A61N 5/00* (2006.01)
*G21G 5/00* (2006.01)

(52) U.S. Cl. ............. 250/492.2; 250/492.1; 250/396 R; 250/400; 250/398; 250/492.22; 250/492.23; 250/491.1; 382/147; 382/149; 356/235.1; 714/5; 714/42

(58) Field of Classification Search ............... 250/492.1, 250/492.2, 396 R, 400, 398, 492.22, 492.23, 250/491.1; 382/147, 149; 356/235.5; 714/5, 714/42

See application file for complete search history.

(56) References Cited

U.S. PATENT DOCUMENTS 7,475,279 B2 *   1/2009   Takahashi et al. .............. 714/5

FOREIGN PATENT DOCUMENTS

JP   10-284392   10/1998

* cited by examiner

*Primary Examiner*—Jack I Berman
*Assistant Examiner*—Meenakshi S Sahu
(74) *Attorney, Agent, or Firm*—Oblon, Spivak, McClelland, Maier & Neustadt, L.L.P.

(57) ABSTRACT

A writing error diagnosis method for a charged beam photolithography apparatus and a charged beam photolithography apparatus which can specify an error cause within a short period of time in occurrence of a pattern writing error are provided. The writing error diagnosis method for a charged beam photolithography apparatus is a writing error diagnosis method for a charged beam photolithography apparatus which irradiates a charged beam on a target object to write a desired pattern. Processing result data of a pattern writing circuit at a position where a pattern writing error occurs is collected after the pattern writing error occurs, and the collected processing result data of the pattern writing circuit is compared with correct data. The charged beam photolithography apparatus has means which realizes the diagnosis method.

20 Claims, 7 Drawing Sheets

WRITING ERROR DIAGNOSIS METHOD FOR CHARGED PARTICLE BEAM PHOTOLITHOGRAPHY APPARATUS AND CHARGED PARTICLE BEAM PHOTOLITHOGRAPHY APPARATUS

CROSS-REFERENCE TO RELATED APPLICATION

This application is based upon and claims the benefit of priority from the Japanese Patent Application No. 2006-150385, filed on May 30, 2006, the entire contents of which are incorporated herein by reference.

FIELD OF THE INVENTION

The present invention relates to a charged particle beam photolithography apparatus which writes a pattern of an LSI or the like on a target object such as a mask or a wafer, and more particularly, to a writing error diagnosis method for a charged particle beam photolithography apparatus and a charged particle beam photolithography apparatus, which easily specify a cause of a pattern writing error in occurrence of the pattern writing error.

BACKGROUND OF THE INVENTION

A lithography technique which leads development of micropatterning of a semiconductor device is a very important and an only process which generates a pattern in semiconductor manufacturing processes. In recent years, with a high degree of integration of an LSI, a line width of circuit required for a semiconductor device is gradually miniaturized every year. In order to form a descried circuit pattern on the semiconductor device, a high-precision master pattern plate (also called a reticle or a mask) is necessary. An electron beam pattern writing technique using an electron beam (included in charged beams) has an essentially excellent resolution. For this reason, the electron beam pattern writing technique is used in production of a high-precision master pattern plate or a mask.

Prior to pattern writing of an electron beam photolithography apparatus, a layout of a semiconductor integrated circuit serving as a base of a pattern to be written is designed, and layout data (design data) is generated. The layout data is converted to generate internal control format data for the electron beam photolithography apparatus. Furthermore, in the pattern writing circuit, the internal control format data is divided into shot data of a format of the electron beam photolithography apparatus. The shot data is written on a target object on the basis of predetermined writing conditions.

FIG. 7 is a conceptual diagram for explaining an operation of a conventional variable-shaped electron beam photolithography apparatus. An opening 702 having a rectangular shape, for example, an oblong shape to shape an electron beam is formed in a first aperture plate 700 in the variable-shaped electron beam photolithography apparatus (EB photolithography apparatus). In a second aperture plate 704 formed is, for example, an arrow-shaped variable-shaped opening 706 to shape the electron beam having passed through the opening 702 of the first aperture plate into a desired rectangular or triangular shape.

An electron beam 710 emitted from a charged particle source 708 and having passed through the opening 702 of the first aperture plate is deflected by a deflector (not shown). The deflected electron beam 710 passes through a part of the variable-shaped opening 706 of the second aperture plate 704 to irradiate the electron beam on a target object 712 placed on a stage which continuously moves in a predetermined direction (for example, an X direction).

More specifically, a rectangular shape corresponding to an electron beam which can pass through both the opening 702 of the first aperture plate 700 and the variable-shaping opening 706 of the second aperture plate 704 is written in a pattern writing region of the target object 712 placed on a stage which continuously moves in the X direction. A method which causes the electron beam to pass through both the opening 702 of the first aperture plate 700 and the variable-shaping opening 706 of the second aperture plate 704 to form a variable shape is called a variable-shaped beam method.

In such a method using a variable-shaped beam, the number of times of exposure or shot can be made smaller than that in a method using a fixed size spot beam. For this reason, a throughput advantageously increases. As a technique which increasing a throughput, a stage continuously moving scheme is also proposed. This technique is a scheme which performs pattern writing without stopping a stage having a target object placed thereon. According to this scheme, stepping or moving time for a conventional step & repeat scheme which stops the stage during pattern writing can be reduced.

Furthermore, a so-called vector scanning scheme is also proposed which divides a region to write into small regions called sub-fields and deflects and irradiates a variable-shaped beam on only a portion on which a pattern must be written. On the other hand, a conventional one-dimensional scanning scheme scans all writing region with beam off for no-pattern area. For this reason, an increase in throughput can be achieved after all (see Published Unexamined Japanese Patent Application No. 10-284392, for example).

SUMMARY OF THE INVENTION

As described above, an increase in throughput and improvement of a writing resolution have been designed in an electron beam photolithography technique. In addition to the improvement of the pattern writing technique, it is important to rapidly specify a cause of error in occurrence of a pattern writing error. This is because, once a pattern writing error occurs, not only the mask with the error cannot be used but also production of masks is stopped until a cause of writing error is specified and a countermeasure against the pattern writing error is made, thereby resulting in tremendous damage.

A pattern writing error (pattern error) is a phenomenon in which a pattern designed by a user cannot be exactly written on a target object. As one of main causes of writing error, abnormal processing in a pattern writing circuit is known. More specifically, in the abnormal processing, a normal output (processing result) cannot be obtained from a pattern writing circuit due to a defect, a defective operation, or the like in a circuit board or an element which constitutes the pattern writing circuit. Essentially, even though a pattern writing error occurs in a prior art, there is no effective means for easily recognizing apparatus states when a pattern writing error occurs, i.e., writing data, a pattern writing condition, a writing pattern. As a result, time is consumed to specify a cause of error.

The present invention has been made in consideration of the above circumstances, and has as its object to provide a writing error diagnosis method for a charged beam photolithography apparatus and a charged beam photolithography apparatus, which can specify an error cause (error occurrence state) within a short period of time when a pattern writing error occurs.

A writing error diagnosis method for a charged beam photolithography apparatus which irradiates a charged beam on a target object to write a desired pattern, according to an embodiment of the present invention, comprises: collecting processing result data of a pattern writing circuit at a position where a pattern writing error occurs after the pattern writing error occurs; and comparing the collected processing result data with correct data.

A charged beam photolithography apparatus which irradiates a charged beam on a target object to write a desired pattern, according to another embodiment of the present invention, comprises: collecting means which collects processing result data of a pattern writing circuit at a position where a pattern writing error occurs after the pattern writing error occurs; and comparing means which compares the collected processing result data of the pattern writing circuit at the position where the pattern writing error occurs with correct data.

According to the embodiments of the present invention, a writing error diagnosis method for a charged beam photolithography apparatus and a charged beam photolithography apparatus, which can specify an error cause (error occurrence state) within a short period of time when a pattern writing error occurs.

DETAILED DESCRIPTION OF THE EMBODIMENTS

Embodiments of a writing error diagnosis method for a charged beam photolithography apparatus and a charged beam photolithography apparatus according to the present invention will be described below by using an electron beam photolithography apparatus as an example with reference to the accompanying drawings.

First Embodiment

Figure 2:
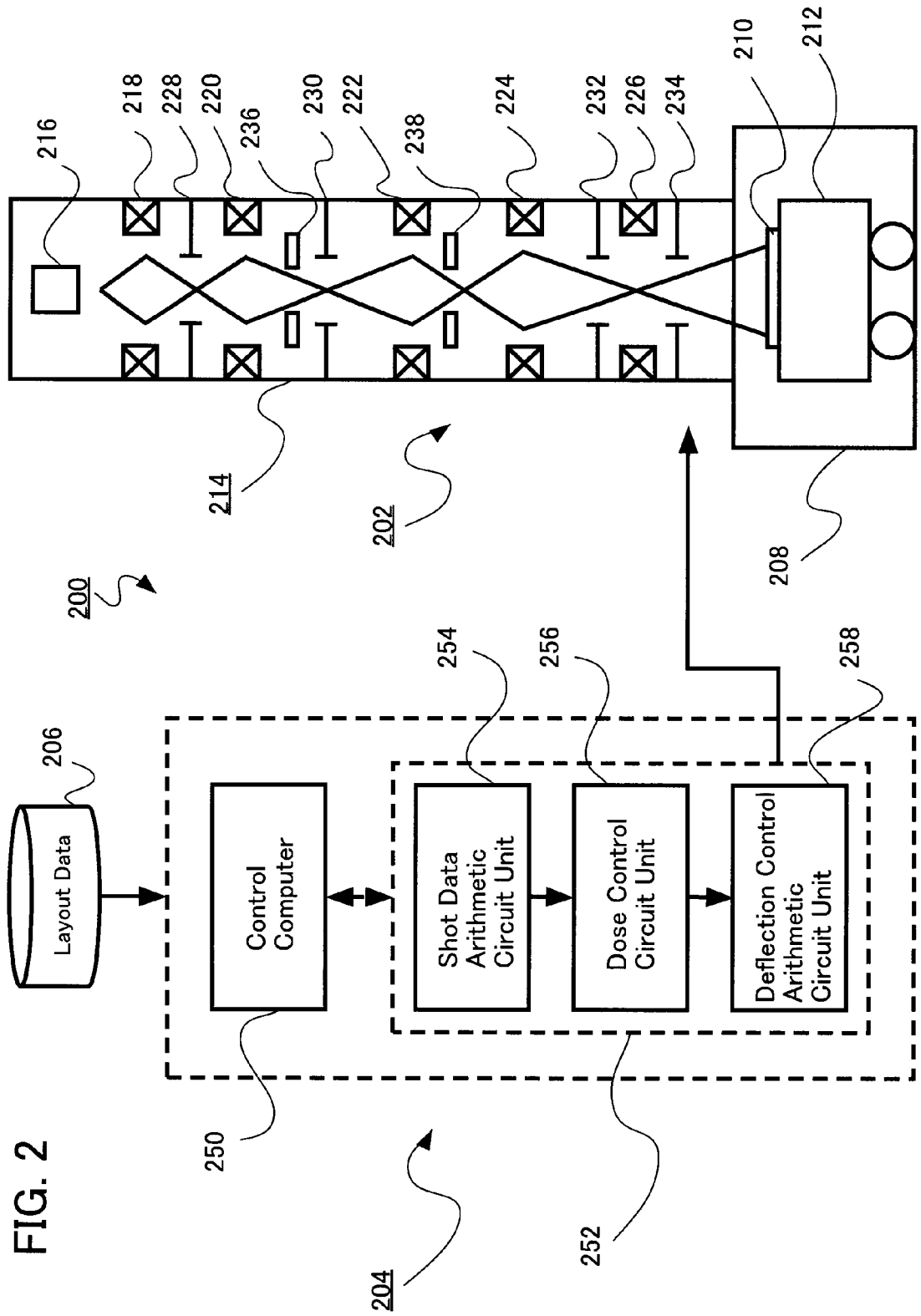
FIG. 2 is a schematic block diagram of electron beam writing apparatuses according to the first and second embodiments.

FIG. 2 is a schematic block diagram of an electron beam photolithography apparatus according to a first embodiment. An electron beam photolithography apparatus 200 is constituted by a pattern writing unit 202 and a writing control unit 204 which controls a pattern writing operation of the pattern writing unit 202. Layout data 206 (design data) of a semiconductor integrated circuit to be drawn is input and stored in advance in the electron beam photolithography apparatus 200.

In the pattern writing unit 202, a stage 212 on which a target object 210 such as a mask is placed is accommodated in a target object chamber 208. The stage 212 is driven in an X direction (left and right directions on the paper) and a Y direction (back and forth directions on the paper) by the writing control unit 204.

An electron beam optical system 214 is arranged above the target object chamber 208. The electron beam optical system 214 is constituted by an electron gun assembly 216, various lenses 218, 220, 222, 224, and 226, a blanking deflector 228, a beam size varying deflector 230, a main deflector 232 for scanning a beam, a sub-deflector 234 for scanning a beam, a first aperture plate 236 for shaping a beam to write a pattern by a variable-shaped beam, a second aperture plate 238, and the like.

In actual pattern writing, an electron beam emitted from the electron gun assembly 216 is controlled by the beam size varying deflector 230 and the first aperture plate 236 and second aperture plate 238 for shaping a beam to have a variable shape. A pattern writing process is performed by a vector scanning scheme (two-dimensional scanning scheme) and a stage continuously moving scheme.

Figure 3:
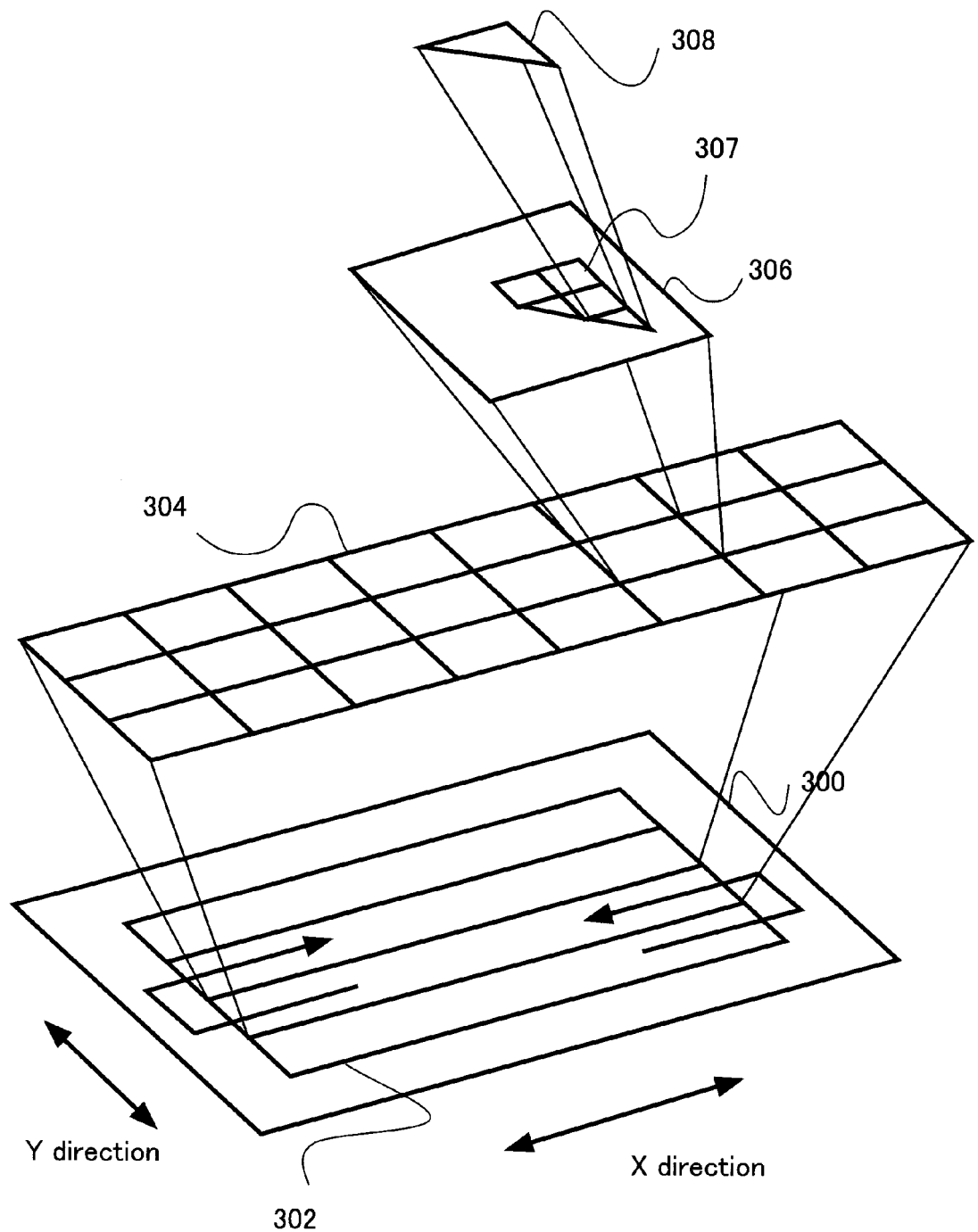
FIG. 3 is a diagram for explaining pattern writing methods using a vector scanning scheme and a stage continuously moving scheme employed in the first and second embodiments.

Now, a pattern writing process will be described below a diagram for explaining a pattern writing method using the vector scanning scheme and the stage continuously moving scheme employed in the embodiment in FIG. 3. First, a pattern 302 to be written on a target object 300 is divided into strip-shaped regions called frames 304. The frame 304 is further divided into regions called sub-fields 306. A pattern is written on only a necessary portion in the regions by deflecting a variable-shaped beam 308 shaped by the first aperture plate 236 and the second aperture plate 238 shown in FIG. 2.

A pattern writing process is performed while continuously moving the stage 212 (FIG. 2). At this time, a two-step deflector constituted by the main deflector 232 and the sub-deflector 234 (FIG. 2) is used. The sub-fields 306 are positioned by the main deflector 232 (FIG. 2) according to main deflection position data sent from a deflection control arithmetic circuit unit 258. Writing in the sub-fields 306 is performed by the sub-deflector 234 according to sub-deflection position data and shot size data also sent from the deflection control arithmetic circuit unit 258.

Upon completion of the pattern writing of one of the sub-fields 306, pattern writing of the next one of the sub-fields 306 is started. Upon completion of pattern writing of the frame 304 serving as a set of the plurality of sub-fields 306, the stage 212 which continuously moves in an X direction is moved in steps in a Y direction. The above process is repeated to sequentially write patterns on the respective frame regions. In this case, the frame 304 is a strip-shaped writing region determined by a deflection width of the main deflector 232 (FIG. 2). The sub-field 306 is a unit writing region determined by a deflection width of the sub-deflector 234 (FIG. 2).

The pattern writing control unit 204 which controls a pattern writing process of the pattern writing unit 202 will be described below with reference to FIG. 2. The pattern writing control unit 204 is constituted by a control computer 250 and a pattern writing circuit 252. The layout data 206 is converted into internal control format data unique to this electron beam photolithography apparatus by processing performed in the control computer 250. At this time, the regions of the sub-fields 306 are formed. Thereafter, the internal control format data is given to the pattern writing circuit 252 together with a pattern writing parameter file 114.

Internal control format data 112 (FIG. 1) is obtained by converting layout data including a predetermined pattern into data for the electron beam photolithography apparatus. More specifically, used are, for example, main deflection position data for specifying the frame 304 (FIG. 3) including the predetermined pattern and the sub-fields 306 (FIG. 3) and sub-deflection position data for specifying writing positions of pattern figures in the sub-fields (FIG. 3).

The pattern writing parameter file 114 (FIG. 1) is a pattern writing condition applied in a pattern writing circuit 111. Specific examples of parameters constituting the pattern writing parameter file include a pattern figure dividing parameter used in a shot data arithmetic circuit unit 254, a proximity effect correction coefficient used in a dose control circuit unit 256, a fogging effect correction coefficient, a main deflection distortion correction coefficient used in a deflection control arithmetic circuit unit 258, and a sub-deflection distortion coefficient.

The shot data arithmetic circuit unit 254 constituting the pattern writing circuit 252 divides, according to a pattern figure dividing parameter, a pattern FIG. 307 into figures each having a size and a shape which can be irradiated or shot on a target object surface by irradiating the variable-shaped beam 308 once. The pattern FIG. 307 is a pattern the size and shape of which can be arbitrarily designated by a user in the internal control format data.

The dose control circuit unit 256 adds beam irradiation time calculated from a result of proximity effect correction, fogging effect correction, and the like to each of the divided figures of the pattern FIG. 307 divided by the shot data arithmetic circuit unit 254. The addition of the beam irradiation time is performed to write more accurate patterns. The deflection control arithmetic circuit unit 258 generates control data to control the pattern writing unit 202 on the basis of an output result (processing result) from the dose control circuit unit 256 and correction coefficients such as the main deflection distortion correction coefficients and the sub-deflection distortion correction coefficients. The shot data arithmetic circuit unit 254, the dose control circuit unit 256, and the deflection control arithmetic circuit unit 258 are further divided into a plurality of circuits depending on the functions.

These writing circuits have storage means called maintenance memories in which processing result data obtained by the respective circuits are temporarily stored. However, in general, the memory capacities of the storage means are so small that only processing result data corresponding to regions of several to several ten sub-fields can be stored in the storage means.

As will be described below in detail, the electron beam photolithography apparatus 200 according to the embodiment includes, in the pattern writing control unit 204, collecting means and comparing means. The collecting means collects maintenance memory data serving as processing result data of the pattern writing circuit, i.e., shot data or control data at a position where a pattern writing error occurs after the pattern writing error occurs. The comparing means compares the collected maintenance memory data with correct data.

Figure 1:
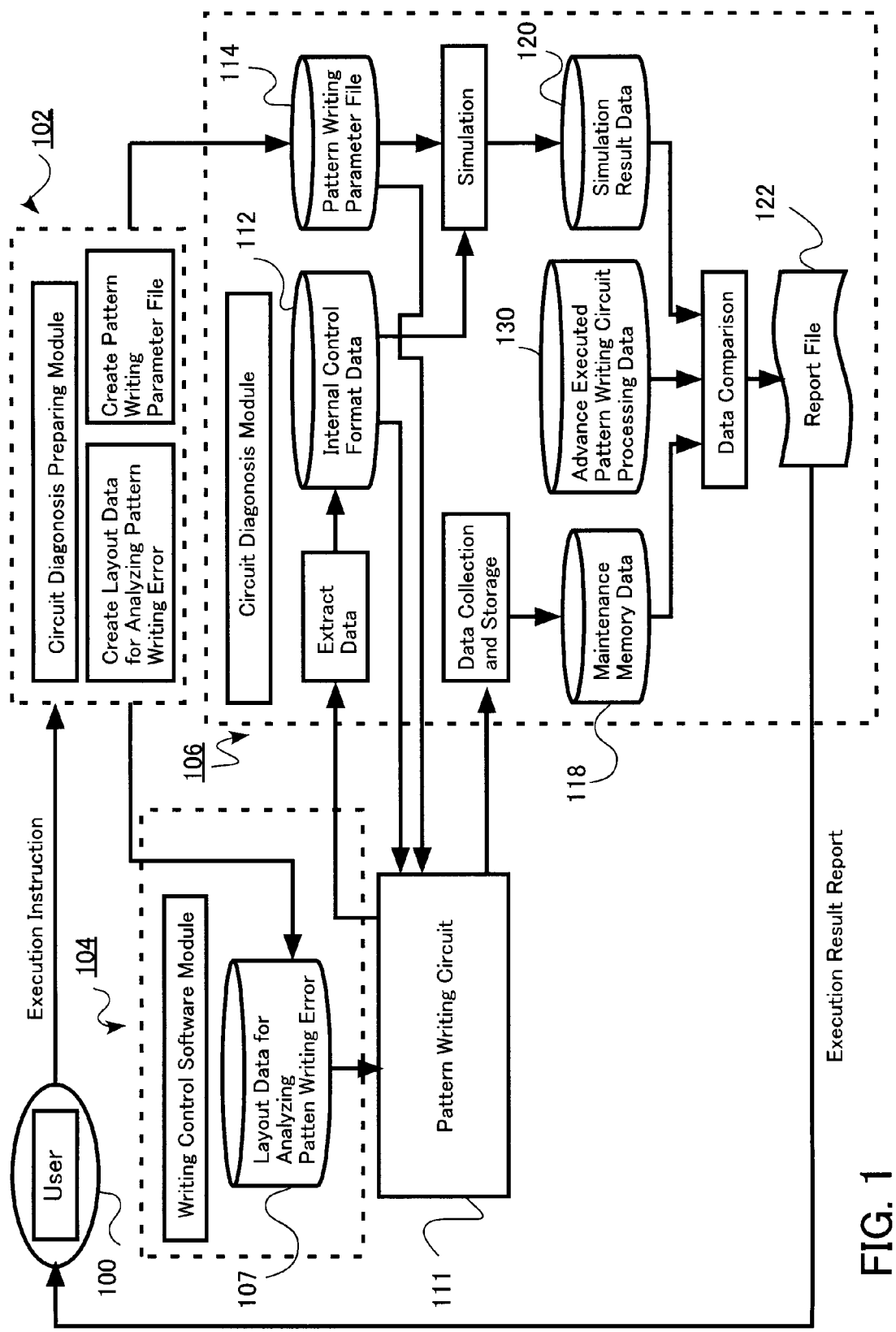
FIG. 1 is an operational block diagram of a writing error diagnosis mechanism which realizes writing error diagnosis methods according to first and second embodiments.

A writing error diagnosis method according to the embodiment will be described below. FIG. 1 is an operational diagram of a writing error diagnosis mechanism which realizes the writing error diagnosis method according to the embodiment. The writing error diagnosis mechanism according to the embodiment which realizes the writing error diagnosis method includes three modules, i.e., a circuit diagnosis preparing module 102, a pattern writing control software module 104, and a circuit diagnosis module 106. In this manner, the writing error diagnosis mechanism is divided into three modules to clarify the roles of the respective modules in the embodiment to simplify writing error diagnosis.

In this case, the circuit diagnosis preparing module 102 is a module which automatically performs preparation to execute the circuit diagnosis module 106 serving as a main body of the writing error diagnosis mechanism according to an instruction from a user 100. The circuit diagnosis preparing module 102 also has a function of outputting a writing error (pattern error) diagnosis result of the circuit diagnosis module 106.

The pattern writing control software module 104 is a module which creates the diagnosis internal control format data 112 for use in the circuit diagnosis module 106 serving as the main body of the writing error diagnosis mechanism on the basis of layout data. Layout data which is externally input data has various formats. However, a diagnosis process of the pattern writing circuit performed by this writing error diagnosis mechanism does not depend on the format of the layout data to be input.

The circuit diagnosis module 106 serving as the main body of the writing error diagnosis mechanism reproduces a pattern writing process at a position where a pattern writing error occurs by using the internal control format data 112 which is created by the writing control software module 104 to give position information in occurrence of the pattern writing error and the pattern writing parameter file 114 which gives a pattern writing condition in occurrence of the pattern writing error. The maintenance memory data serving as the processing result data of the pattern writing circuit is collected. The internal control format data 112 is used to perform simulation. In this manner, the circuit diagnosis module 106 is a module which specifies a pattern writing error (pattern error) cause.

More specifically, diagnosis functions possessed by the writing error diagnosis mechanism are executed by software stored in the control computer 250 in the pattern writing control unit 204 shown in FIG. 2 or a combination of the software and hardware arranged on the pattern writing control unit 204. In other words, the units possessed by the electron beam photolithography apparatus according to the embodiment to realize the diagnosis function are constituted by software stored in the control computer 250 in the pattern writing control unit 204 or constituted by a combination of the software and hardware arranged on the pattern writing control unit 204.

An outline of a writing error diagnosis method will be described below with reference to FIG. 1. When it is found due to inspection by a mask inspection apparatus that a pattern writing error (pattern error) occurs in a mask, the user 100 first sends an instruction for executing writing error diagnosis to the circuit diagnosis preparing module 102. In this case, the circuit diagnosis preparing module 102 creates the pattern writing parameter file 114 which gives pattern writing error analyzing layout data 107 and a pattern writing condition in occurrence of an error in order to enable the writing control software module 104 or the circuit diagnosis module 106 to reproduce a state in occurrence of the pattern writing error, and prepares for diagnosis.

The circuit diagnosis preparing module 102 refers to the prepared file, and the writing control software module 104 starts the pattern writing circuit 111 to perform a pattern writing circuit process. The internal control format data 112 is created from the pattern writing error analyzing layout data 107 generated from original layout data. The original layout data used here is original layout data including a pattern at a position where a pattern writing error is found.

The circuit diagnosis preparing module 102 issues a command to the circuit diagnosis module 106 to collect the internal control format data 112 created by the writing control software module 104. The circuit diagnosis module 106 collects and stores the internal control format data 112, so that the internal control format data 112 can be used as an input to pattern writing circuit simulation in writing error diagnosis.

The pattern writing circuit 111 is started to cause the internal control format data 112 and the pattern writing parameter file 114 to flow to perform a pattern writing circuit process. The circuit process is stopped at predetermined coordinates of a position where a pattern writing error (pattern error) occurs to make it possible to collect maintenance memory data 118 reproduced at the position where the pattern writing error (pattern error) occurs. In this manner, the obtained maintenance memory data 118 at the position where the pattern error occurs is compared with simulation result data 120 serving as collect data to make it possible to specify a pattern writing error (pattern error) cause. The comparison result is edited and stored in a report file 122 and reported to the user 100. In the pattern writing circuit process, pattern writing is not necessarily performed on an actual target object, and so-called virtual pattern writing may be performed by starting only the pattern writing circuit.

Figure 4:
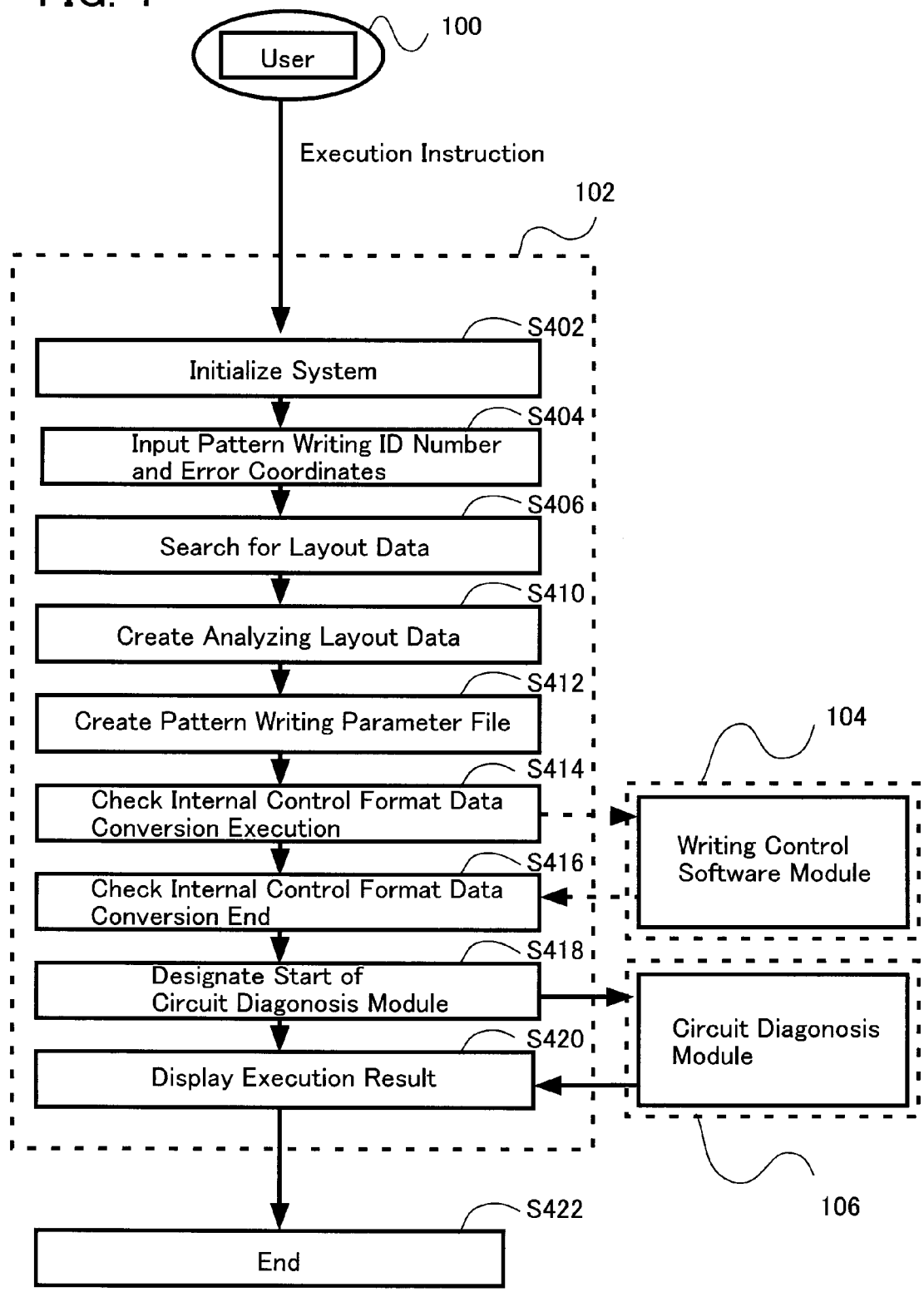
FIG. 4 is a block diagram of operation steps of circuit diagnosis preparing modules according to the first and second embodiments.

Subsequently, operation steps of the circuit diagnosis preparing module 102 will be described below in detail with reference to FIG. 4. When a pattern writing error (pattern error) of a mask is found, the user 100 issues an execution instruction to diagnose the pattern writing error to the circuit diagnosis preparing module 102. The circuit diagnosis preparing module 102 performs system initialization such as a free area check of a work directory in the control computer 250 (FIG. 2) in response to an execution instruction of the user 100 (S402).

The circuit diagnosis preparing module 102 requests the user 100 to input information such as a pattern writing ID number of a mask on which a pattern writing error occurs and error coordinates (X coordinate and Y coordinate) (S404). On the basis of the input pattern writing ID number, a predetermined directory in the control computer is searched for corresponding layout data (S406). The circuit diagnosis preparing module 102 cuts out a region including the selected pattern writing error coordinates to create new layout data for analyzing a pattern writing error (S410). The layout data to be cut out has various formats depending on design software of CAD created by the user. However, an operation of the circuit diagnosis preparing module 102 does not depend on the format of the layout data.

The circuit diagnosis preparing module 102 is referred in diagnosis of a pattern writing error by the writing control software module 104 or the circuit diagnosis module 106 to generate a pattern writing parameter file (FIG. 1) to reproduce a state of a pattern writing circuit in occurrence of the pattern writing error (S412). The circuit diagnosis preparing module 102 starts the writing control software module 104 to urge the user 100 to check execution of internal control format data conversion of newly created layout data for analyzing the pattern writing error (S414). The writing control software module 104 converts the writing error analyzing layout data into internal control format data.

The internal control format data 112 (FIG. 1) is obtained by converting a predetermined pattern, in this case, layout data including a pattern at a position where an error occurs into data for the electron beam photolithography apparatus. In the embodiment, the internal control format data 112 consequently also gives position information of the pattern writing error. More specifically, used are, for example, main deflection position data which specifies the frame 304 including the predetermined pattern and the sub-fields 306 (FIG. 3) and sub-deflection position data which specifies pattern writing positions of pattern figures in the sub-fields.

The pattern writing parameter file 114 (FIG. 1) is a pattern writing condition applied to the pattern writing circuit 111. In the embodiment, the pattern writing parameter file 114 gives a pattern writing condition to reproduce an operation and a processing result of the pattern writing circuit in occurrence of a pattern writing error. The pattern writing condition is generated by referring to a pattern writing log or the like in occurrence of the pattern writing error and collecting information from the pattern writing circuit. Specific examples thereof include a pattern figure diving parameter used in the shot data arithmetic circuit unit 254, a proximity effect correction coefficient used in the dose control circuit unit 256, a fogging effect correction coefficient, a main deflection distortion correction coefficient used in the deflection control arithmetic circuit unit 258, and a sub-deflection distortion coefficient. In this case, in order to reproduce the processing result of the pattern writing circuit in occurrence of an error, it is very important to make the parameters equal to those obtained in occurrence of a pattern writing error.

The user 100 is urged to check the end of internal control format data conversion of the writing control software module 104 (S416). The circuit diagnosis module 106 is designated to be started (S418). Finally, an execution result of the circuit diagnosis module 106 is read and displayed on a display device (S420), and the operation is ended (S422).

Figure 5:
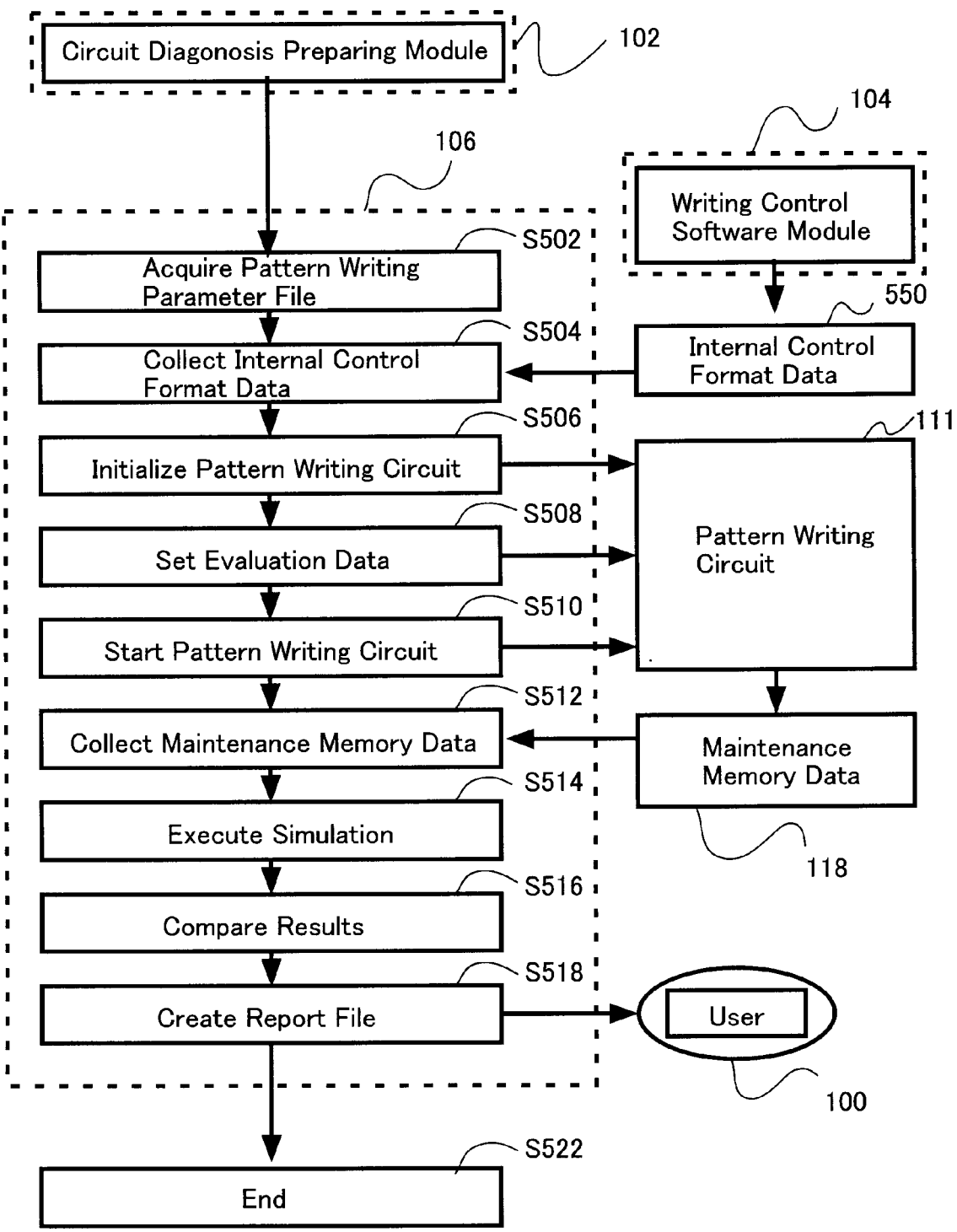
FIG. 5 is a block diagram of operation steps of a circuit diagnosis module according to the first embodiment.

Subsequently, operation steps of the circuit diagnosis module 106 will be described below in detail with reference to FIG. 5. First, a pattern writing parameter file created by the circuit diagnosis preparing module 102 is acquired (S502), and internal control format data 550 created by the writing control software module 104 is collected by the writing control software module 104 (S504).

Upon completion of the collection of the internal control format data 550, the circuit diagnosis module 106 initializes the pattern writing circuit 111 (S506). A pattern writing parameter file and the collected internal control format data 550 (also collectively called evaluation data) are set in the pattern writing circuit 111 (S508). In collection and setting of the internal control format data, with reference to pattern writing circuit stop coordinates or the like which indicate a coordinate position of an error occurrence position designated by the user, only patterns arranged before the designated coordinates in order of pattern writing are extracted. The extraction is performed while searching for respective pattern coordinates recorded in the internal control format data 112 (FIG. 1) in order to stop the pattern writing process near the stop coordinates. Such a processing allows the processing of the pattern writing circuit to be automatically stopped near arbitrary coordinates to obtain processing result data of the pattern writing circuit from the maintenance memory of the pattern writing circuit.

In addition to the extraction of data by comparison with the designated coordinates, a method which extracts data of a specific sub-field to the specific number of pattern figures is known. Furthermore, a method is available which sets a specific pattern writing parameter file to stop the pattern writing circuit itself by the designated coordinates or the specific sub-field and the number of pattern figures in the circuit diagnosis module 106. In addition, a method is also available which sequentially monitors the contents of the maintenance memory of the pattern writing circuit, confirms that the processing reaches the specific coordinates or the specific sub-field and the number of pattern figures, and then forcibly immediately stops the processing of the pattern writing circuit.

Upon completion of the setting of the pattern writing parameter file and the internal control format data (also collectively called evaluation data) (S508), the pattern writing circuit 111 is started to execute a pattern writing process (S510). The pattern writing parameter file and the internal control format data 550 flow into the pattern writing circuit 111. Upon completion of the processing of the pattern writing circuit, the maintenance memory data 118 of the pattern writing circuit 111 is collected (S512). The maintenance memory data 118 is processing result data of the pattern writing circuit at a position where a pattern writing error occurs because the pattern writing process is stopped near stop coordinates input in advance.

In this case, the maintenance memory which holds the maintenance memory data 118 is generally arranged each of a plurality of circuits constituting the shot data arithmetic circuit unit 254, the dose control circuit unit 256, and the deflection control arithmetic circuit unit 258 (FIG. 2) which are included in the pattern writing circuit 111. The maintenance memories temporarily hold processing result data obtained from respective circuit boards.

In this manner, the maintenance memory data 118 serving as processing result data of the pattern writing circuit is read from the maintenance memory serving as storage means to be collected. Upon completion of the collection of the maintenance memory data 118, the circuit diagnosis module 106 inputs the corrected internal control format data 550 and the collected pattern writing parameter file and execute simulation of the pattern writing process in the pattern writing circuit 111 to create correct data (S514). The simulation result data of outputs from the circuits constituting the pattern writing circuit 111 is output. The simulation result data is output for each of the circuit boards constituting the pattern writing circuit 111 in the same data format as that of the actual maintenance memory data 118.

The collected maintenance memory data 118 (maintenance memory data) and the simulation result data serving as correct data are compared with each other in each of the circuit boards (S516). A report file is created so as to cause the user to easily recognize the comparison result (S518), and the operation is ended (S552).

A comparison result of the maintenance memory data and the simulation result data in each of the circuit boards is displayed in the report file. When both the results are equal to each other as a comparison result, it can be confirmed that the pattern writing circuit 111 is normal. If the results are different from each other, it can be instantaneously confirmed that a circuit having the difference is abnormal. The maintenance memory data and the simulation result data can display how an electron beam is focused on a target object when these data are actually written on a display device. When the displayed result is compared with an observation result of the pattern writing error unit, a state of the error can be visually recognized.

Specific examples of detection of an abnormal position by the report file include a pattern writing error which the size of a part of a pattern on a target object is temporarily larger than a design value. As a cause of the error, the followings are conceived. That is, a pattern size increases due to abnormality of the shot data arithmetic circuit unit 254 or the deflection control arithmetic circuit unit 258, or a does may increase due to abnormality of the dose control circuit unit 256. In this case, an abnormal portion can be easily separated by displaying a comparison result of the portion and the collected maintenance memory data in the report file output from the mechanism.

The embodiment has described an aspect in which the processing result data of the pattern writing circuit is stored as the maintenance memory data 118 in the maintenance memory arranged in the pattern writing circuit. However, the method of storing the processing result data of the pattern writing circuit is not limited to the aspect. For example, an aspect in which processing result data on all circuit boards are stored in a storing apparatus arranged outside the photolithography apparatus at once may be used.

When a mask in which a pattern writing error occurs is written by multi-pass pattern writing, collection of the maintenance memory data 118 related to a plurality of pattern writing operations and comparison with the correct data may be performed by one process. In this case, the multi-pass pattern writing is a technique which reduces a random error and a systematic error in shaping or positioning of an electron beam to assure mask writing accuracy. More specifically, the multi-pass pattern writing means that the same pattern is written twice or more while shifting a pattern writing region.

In the embodiment, the electron beam photolithography apparatus using the variable-shaped beam scheme, the vector scanning scheme, or the stage continuously moving scheme has been described. However, since the present invention is effectively applied to an electron beam photolithography apparatus using the step & repeat scheme or the like, the embodiment is not limited to the electron beam photolithography apparatus using the variable-shaped beam scheme, the vector scanning scheme, or the stage continuously moving scheme.

In the embodiment, the configuration divided into three modules, i.e., the circuit diagnosis preparing module, the circuit diagnosis module, and the pattern writing control software module has been described. However, the configuration is an example to simplify writing error diagnosis, and the configuration is not a necessary requirement for the present invention.

In a prior art, even though a pattern writing error (pattern error) of a mask is found by inspection of a mask defect inspecting apparatus, a lot of time is consumed to specify a cause of error. In general, causes of an error are roughly classified into 1) abnormality of layout data itself, 2) abnormality and an erroneous operation in the pattern writing circuit, and 3) abnormality and a defective operation in an analog system such as a DAC amplifier. If abnormality in the pattern writing circuit can be specified as a result of the separation, a method of further separating and specifying a position and a board of abnormality occurring in the pattern writing circuit is employed. However, there is no method of easily separating and specifying abnormality, especially, in a pattern writing circuit, long time is required to specify a position where an error occurs.

More specifically, for example, in order to check an apparatus state of the electron beam photolithography apparatus in occurrence of an pattern writing error, layout data including a pattern writing error occurrence position is first cut with manual operation. Internal control format data, etc. based on the layout data is caused to flow into the pattern writing circuit with manual operation. Predictably, a pattern writing circuit process is stopped near the error position with manual operation. Furthermore, an operation of collecting an execution result of the pattern writing circuit with manual operation is required. In this operation, in particular, it is very difficult to stop the pattern writing circuit at a desired position manually. For this reason, in order to obtain necessary data, huge amounts of time are consumed to repeat a trial and error process. In verification of the collected execution result of the pattern writing circuit, there is no correct data, and therefore, it must be experimentally determined whether the pattern writing circuit is normal or abnormal, and efficiency and accuracy are insufficient.

In particular, abnormality of the pattern writing circuit and a defective operation may be reproduced at 100%, and a test may be required to be performed many times. In such a case, it is a further serious problem that long time is required to perform analysis one time.

The presence/absence of abnormality of the layout data is checked by using display of the layout data, an analyzing tool, and the like. The embodiment enables collection of final processing result data in a pattern writing circuit corresponding to a pattern error as well as easy collection and creation of the correct data (simulation data or the like). The comparison makes it possible to rapidly determine whether the pattern writing is abnormal upon completion of processing in the pattern writing circuit. When abnormality is not detected in this stage, it is determined that the pattern writing circuit is normal as a whole. It is found that a downstream analog system is probably abnormal.

According to the embodiment, when a user inputs position information of a pattern writing error and a pattern writing condition in occurrence of a pattern writing error, processing result data can be automatically reproduced and collected by the pattern writing circuit corresponding to the pattern writing error. Furthermore, correct data can be obtained by simulation based on the pattern writing condition in occurrence of the pattern writing error.

The collected processing result data and the correct data of the simulation result data are automatically compared with each other to make it possible to efficiently verify an execution result of the pattern writing circuit in occurrence of a pattern writing error in comparison with a prior art.

Therefore, as described above, it is possible to provide a writing error diagnosis method for a charged beam photolithography apparatus and a charged beam photolithography apparatus, which can rapidly determine a specific circuit board on which abnormality occurs in the pattern writing circuit in occurrence of a pattern writing error by verifying the pattern writing circuit data, and which can specify an error cause within a short period of time.

Second Embodiment

A second embodiment of the present invention will be described below. The second embodiment is the same as the first embodiment except that maintenance memory data which reproduces a collected state in which a pattern writing error occurs is compared with processing result data (also called advance executed pattern writing circuit processing result data) 130 (FIG. 1) of a pattern writing circuit obtained by executing a pattern writing process in advance as a correct data not the simulation result data 120 (FIG. 1) as correct data. The same description will be omitted.

Figure 6:
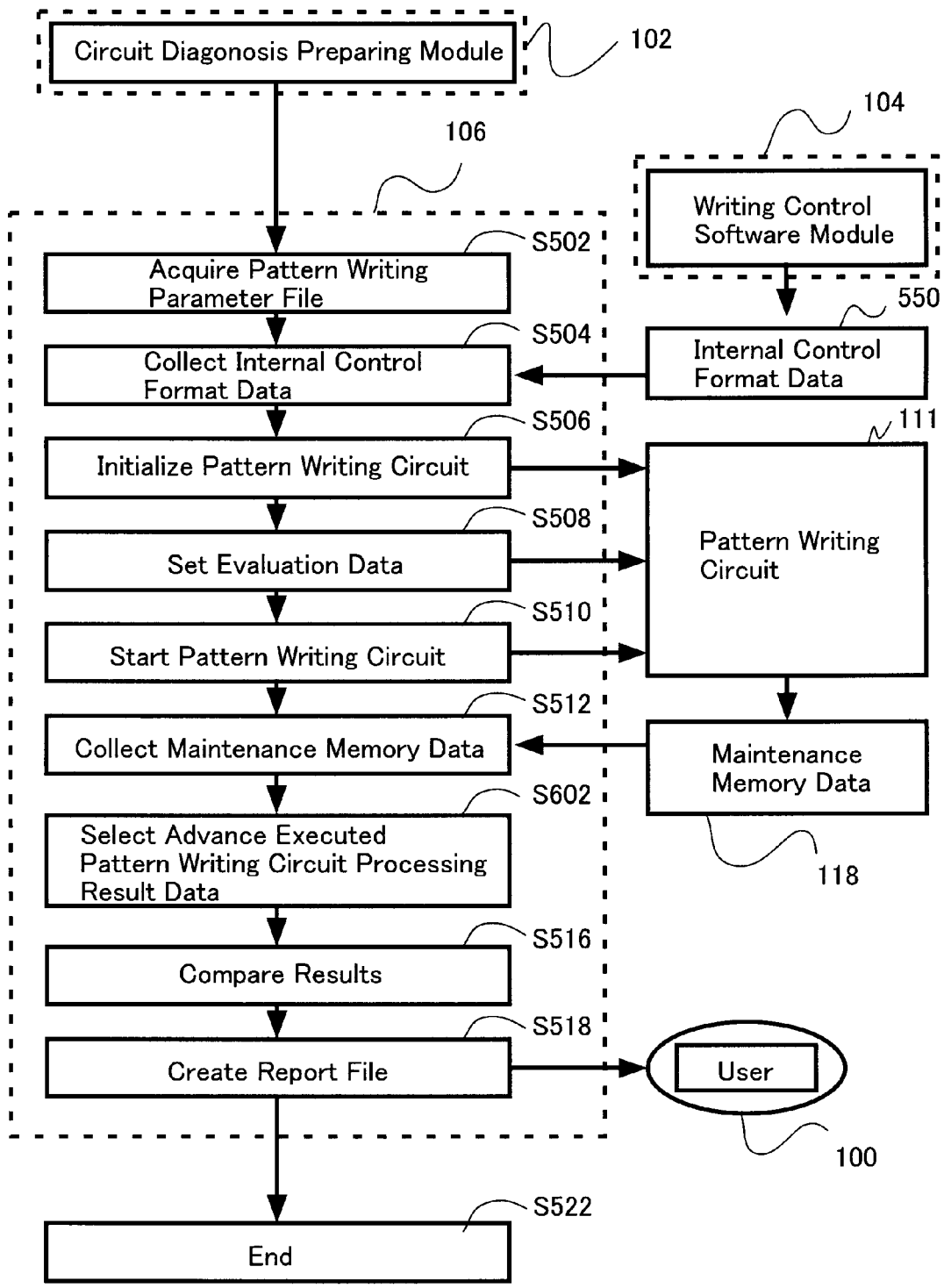
FIG. 6 is a block diagram of operation steps of a circuit diagnosis module according to the second embodiment.
Figure 7:
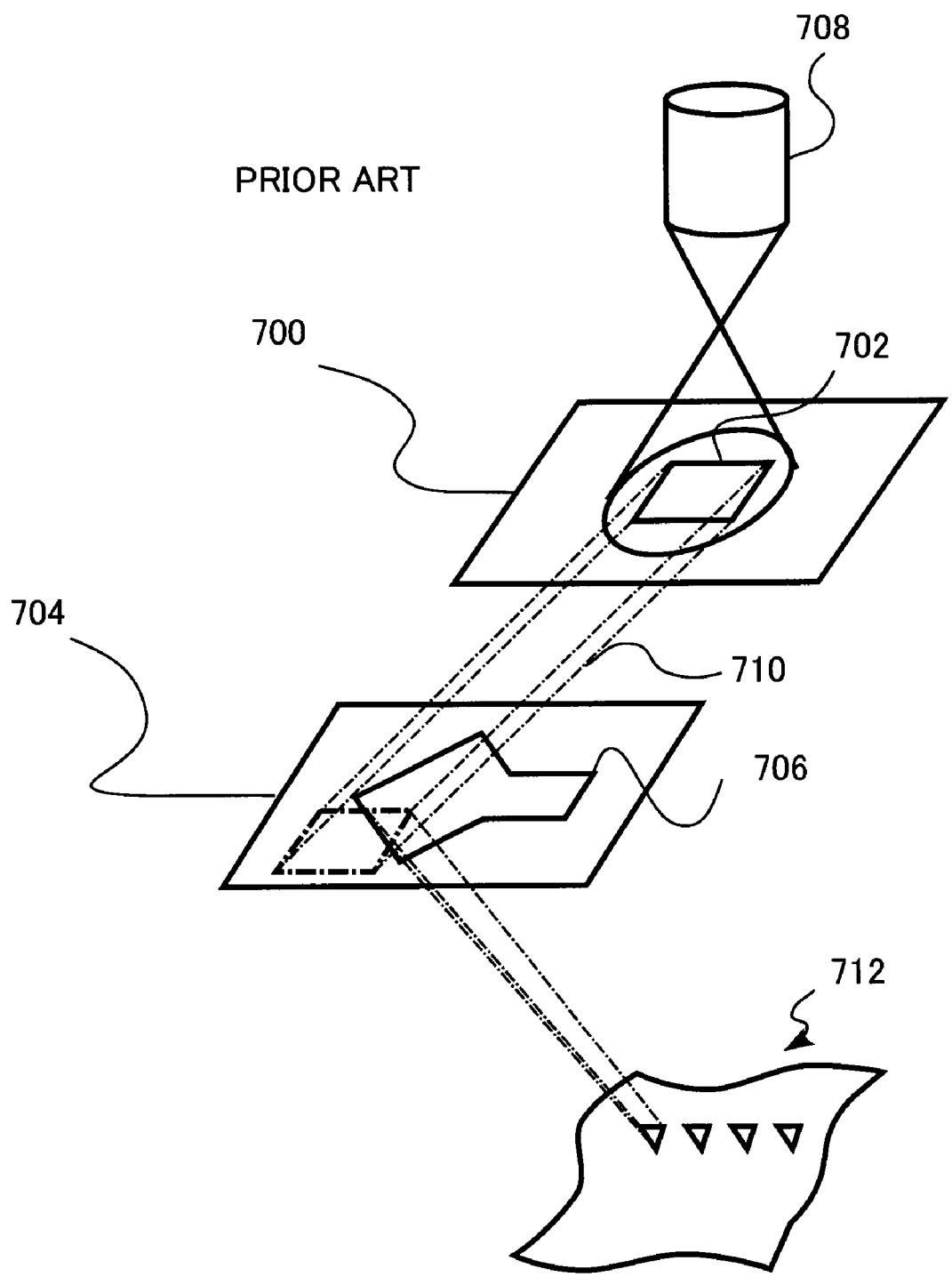
FIG. 7 is a conceptual diagram for explaining an operation of a conventional variable-shaped electron beam photolithography apparatus.

FIG. 6 is a diagram for explaining operation steps of a circuit diagnosis module 106 according to the embodiment. Since the operation steps up to the step (S512) of collecting the maintenance memory data 118 are the same as those in the first embodiment, a description thereof will be omitted. After the collection of maintenance memory data (S512), the circuit diagnosis module 106 urges a user to select advance executed pattern writing circuit processing result data to be compared with the collected maintenance memory data 118 (S602). In this case, the advance executed pattern writing circuit processing result data 130 (FIG. 1) is maintenance memory data stored in the circuit diagnosis module 106. The maintenance memory data is the maintenance memory data 118 which is collected from the pattern writing circuit by executing the circuit diagnosis module 106 by using the same internal control format data and a pattern writing parameter in advance.

The maintenance memory data 118 collected by the circuit diagnosis module 106 is compared with the maintenance memory data stored as the advance executed pattern writing circuit processing result data 130 as correct data (S516). Thereafter, a report file is created so as to enable a user to easily recognize a comparison result (S518), and the operation is ended (S520). This point is the same as that in the first embodiment.

In this manner, when the maintenance memory data stored in the circuit diagnosis module 106 is used as correct data, simulation to obtain correct data to be compared can be omitted. Accordingly, it becomes possible to provide a charged beam photolithography method for an electron beam photolithography apparatus and an electron beam photolithography apparatus which can specify an error cause within a short period of time. According to this method, reproduction in occurrence of a pattern writing error and verification of a pattern writing circuit can be performed twice or more within a short period of time. For this reason, the method becomes operative when reproducibility of occurrence of an error is checked or when it is confirmed that an error does not reappear after a specific portion where abnormality occurs is exchanged.

The first and second embodiments of the present invention have been described with reference to specific examples. In the descriptions of the first and second embodiments, descriptions of parts or the like which are not directly required to explain the present invention are omitted in the writing error diagnosis method for a charged beam photolithography apparatus and the charged beam photolithography apparatus. However, required elements related to the writing error diagnosis method for a charged beam photolithography apparatus and the charged beam photolithography apparatus can be appropriately selected and used.

All writing error diagnosis methods for charged beam photolithography apparatuses and all charged beam photolithography apparatuses which include the elements of the present invention and which can be appropriately changed in design by a person skilled in the art are included in the spirit and scope of the invention.

What is claimed is:

1. A writing error diagnosis method for a charged beam photolithography apparatus, the apparatus irradiates a charged beam on a target object to write a desired pattern, comprising:
   collecting processing result data of a pattern writing circuit at a position where a pattern writing error occurs after the pattern writing error occurs; and
   comparing the collected processing result data with correct data.

2. The writing error diagnosis method for a charged beam photolithography apparatus according to claim 1, wherein
   the collection of processing result data of a pattern writing circuit at a position where a pattern writing error occurs is performed by:
   inputting position information of the position where the pattern writing error occurs and a pattern writing condition in pattern writing at the position where the pattern writing error occurs to the pattern writing circuit;
   executing processing of the pattern writing circuit; and stopping the processing of the pattern writing circuit at the position where the pattern writing error occurs.

3. The writing error diagnosis method for a charged beam photolithography apparatus according to claim 1, wherein
the correct data is simulation result data processed in the charged beam photolithography apparatus.

4. The writing error diagnosis method for a charged beam photolithography apparatus according to claim 1, wherein
the correct data is processing result data of the pattern writing circuit obtained by executing a pattern writing process in advance.

5. The writing error diagnosis method for a charged beam photolithography apparatus according to claim 1, wherein
the position information is data obtained in such a manner that layout data including a pattern at the pattern writing error occurrence position is converted for the charged beam photolithography apparatus.

6. The writing error diagnosis method for a charged beam photolithography apparatus according to claim 1, wherein
when the pattern writing circuit is constituted by a plurality of circuit boards, the collection of the processing result data and the comparison of the processing result data with correct data are performed for each of the circuit boards.

7. The writing error diagnosis method for a charged beam photolithography apparatus according to claim 1, wherein
a result obtained by the comparison is displayed on a display device.

8. The writing error diagnosis method for a charged beam photolithography apparatus according to claim 2, wherein
stopping of the processing of the pattern writing circuit at the position where the pattern writing error occurs is performed on the basis of a coordinate position of the error occurrence position.

9. The writing error diagnosis method for a charged beam photolithography apparatus according to claim 2, wherein
the collection of processing result data of the pattern writing circuit at a position where the pattern writing error occurs is performed by storing the processing result data of the pattern writing circuit at a timing when the processing is stopped at the pattern writing error occurrence position in storage means, and reading the processing result data stored in the storage means.

10. The writing error diagnosis method for a charged beam photolithography apparatus according to claim 1, wherein
the charged beam is an electron beam.

11. A charged beam photolithography apparatus, the apparatus irradiates a charged beam on a target object to write a desired pattern, comprising:
collecting means for collecting processing result data of a pattern writing circuit at a position where a pattern writing error occurs after the pattern writing error occurs; and
comparing means for comparing the collected processing result data of the pattern writing circuit at the position where the pattern writing error occurs with correct data.

12. The charged beam photolithography apparatus according to claim 11, wherein
the collecting means includes:
input means for inputting position information of the position where the pattern writing error occurs and a pattern writing condition in pattern writing at the position where the pattern writing error occurs to the pattern writing circuit;
executing means for executing processing of the pattern writing circuit; and
stop means for stopping the processing of the pattern writing circuit at the position where the pattern writing error occurs.

13. The charged beam photolithography apparatus according to claim 11, wherein
the correct data is simulation result data processed in the charged beam photolithography apparatus.

14. The charged beam photolithography apparatus according to claim 11, wherein
the correct data is processing result data of the pattern writing circuit obtained by executing a pattern writing process in advance.

15. The charged beam photolithography apparatus according to claim 11, wherein
the position information is data obtained in such a manner that layout data including a pattern at the pattern writing error occurrence position is converted for the charged beam photolithography apparatus.

16. The charged beam photolithography apparatus according to claim 11, wherein
when the pattern writing circuit is constituted by a plurality of circuit boards, the collection of the processing result data and the comparison of the processing result data with correct data are performed for each of the circuit boards.

17. The charged beam photolithography apparatus according to claim 11, further comprising
display means for displaying a result obtained by the comparing means on a display device.

18. The charged beam photolithography apparatus according to claim 12, wherein
the stop means is means for stopping the processing on the basis of a coordinate position of the error occurrence position.

19. The charged beam photolithography apparatus according to claim 12, wherein
the collecting means includes storage means for storing the processing result data of the pattern writing circuit at a timing when the processing is stopped at the pattern writing error occurrence position, and reading means which reads the processing result data stored in the storage means.

20. The charged beam photolithography apparatus according to claim 11, wherein
the charged beam is an electron beam.

* * * * *